（12）United States Patent
Buch et al.

(10) Patent No.: US 9,577,650 B2
(45) Date of Patent: Feb. 21, 2017

(54) PHASE LOCK LOOP LOCK INDICATOR

(71) Applicant: Microchip Technology Incorporated, Chandler, AZ (US)

(72) Inventors: Fredrik Buch, Santa Clara, CA (US); Cristian Albina, Chandler, AZ (US); Yong Yuenyongsgool, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 251 days.

(21) Appl. No.: 14/186,609

(22) Filed: Feb. 21, 2014

(65) Prior Publication Data

US 2014/0240003 A1 Aug. 28, 2014

Related U.S. Application Data

(60) Provisional application No. 61/767,980, filed on Feb. 22, 2013.

(51) Int. Cl.
*H03L 7/087* (2006.01)
*H03L 7/095* (2006.01)
*H03K 5/26* (2006.01)
*H03L 7/097* (2006.01)
*H03L 7/089* (2006.01)

(52) U.S. Cl.
CPC ............ *H03L 7/087* (2013.01); *H03K 5/26* (2013.01); *H03L 7/089* (2013.01); *H03L 7/095* (2013.01); *H03L 7/097* (2013.01)

(58) Field of Classification Search
CPC .......... H03L 7/087; H03L 7/089; H03L 7/095; H03L 7/097
See application file for complete search history.

(56) References Cited

U.S. PATENT DOCUMENTS

| 6,133,769 | A | 10/2000 | Fontana et al. | 327/156 |
|---|---|---|---|---|
| 6,704,383 | B2 * | 3/2004 | Lee | H03L 7/087 |
| | | | | 327/156 |
| 6,798,858 | B1 * | 9/2004 | Atallah | H03L 7/085 |
| | | | | 370/516 |
| 6,927,635 | B2 * | 8/2005 | Miki | H03L 7/095 |
| | | | | 331/1 A |
| 7,082,178 | B2 * | 7/2006 | Meltzer | H03L 7/0891 |
| | | | | 331/DIG. 2 |
| 7,183,861 | B2 * | 2/2007 | Jung | H03L 7/0891 |
| | | | | 331/1 A |
| 7,480,361 | B1 * | 1/2009 | Zhang | H03L 7/0812 |
| | | | | 375/376 |
| 2005/0046486 | A1 | 3/2005 | Miki et al. | 331/17 |
| 2011/0254601 | A1 | 10/2011 | Xiu | 327/157 |

OTHER PUBLICATIONS

International Search Report and Written Opinion, Application No. PCT/US2014/017882, 10 pages, May 28, 2014.

* cited by examiner

*Primary Examiner* — Patrick O'Neill
(74) *Attorney, Agent, or Firm* — Slayden Grubert Beard PLLC (57) ABSTRACT

A lock-on detection circuit for a phase-locked loop includes circuitry configured to receive first up and down outputs and second up and down outputs from one or more phase detectors and to determine from the first up and down outputs and the second up and down outputs how well the phase-locked loop is locked on to a reference clock.

25 Claims, 7 Drawing Sheets

PHASE LOCK LOOP LOCK INDICATOR

CROSS-REFERENCE TO RELATED APPLICATION(S)

This application claims the benefit of U.S. Provisional Application Ser. No. 61/767,980 filed Feb. 22, 2013, which is incorporated by reference in its entirety as if fully set forth herein.

TECHNICAL FIELD

The present disclosure relates to phase-locked loops and, in particular, to a phase-locked loop lock indicator.

BACKGROUND

A phase-locked loop (PLL) circuit is a feedback system that generates an output signal whose phase is constant relative to the phase of an input reference signal. In addition to synchronizing signals, a phase-locked loop can generate a frequency that is a multiple of the input frequency.

Figure 1:
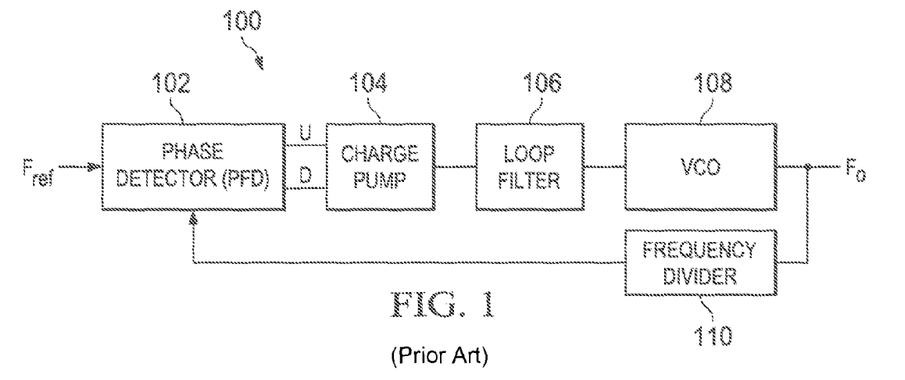
FIG. 1 is a block diagram of an example of a typical PLL circuit.

For example, shown in FIG. 1 is a typical PLL circuit 100. The PLL 100 includes a phase detector (PFD) 102, charge pump 104, loop filter 106, and VCO 108. The phase detector 102 compares the input signal and a feedback signal. The PFD 102 detects the difference in phase and frequency between the reference signal Fref and a feedback signal and generates an "up" U or "down" D control signal based on whether the feedback frequency is lagging or leading the reference frequency. These "up" or "down" control signals determine whether the VCO 108 needs to operate at a higher or lower frequency, respectively.

The PFD 102 outputs these "up" and "down" signals to the charge pump 104. If the charge pump 104 receives an up signal, current is driven into the loop filter 106. Conversely, if it receives a down signal, current is drawn from the loop filter 106.

The loop filter 106 converts these signals to a control voltage that is used to bias the VCO 108. Based on the control voltage, the VCO 108 oscillates at a higher or lower frequency, which affects the phase and frequency of the feedback clock. If the PFD 102 produces an up signal, then the VCO frequency increases. A down signal decreases the VCO frequency. The VCO 108 stabilizes once the reference clock and the feedback clock have the same phase and frequency. The loop filter 106 filters out jitter by removing glitches from the charge pump and preventing voltage over-shoot.

In some implementations, a frequency divider 110 is provided in the feedback path. Negative feedback forces the error signal output from the phase detector 102 to approach zero. At this point, the feedback divider output 110 and the reference frequency are in phase and frequency lock, i.e., aligned, the PLL is considered locked.

PLL circuits are often used in integrated processors and microcontrollers to provide an internal system clock. An external or internal clock determining component, such as a crystal or an RC (resistor-capacitor) component may be used. The crystal may have a relatively low oscillation frequency and the PLL circuit is used to multiply this base frequency to multiples of the base frequency for providing an internal high frequency system clock. However, PLL circuits are not immediately stable when a circuit is powered on.

In some applications, it is desirable to know when the PLL is locked on (stable). According to conventional lock-on detectors, a PLL is determined to be locked on via the use of counters, one on the input clock and one on the feedback clock, and checking that both the counters have the same count. However, missing by one count is a very relaxed criterion for lock-on in many situations; the desired lock is much tighter than that.

SUMMARY

In accordance with some embodiments, a circuit is provided to indicate when a divided down version of an output signal of a Phase Locked Loop (PLL) has a frequency sufficiently close to the frequency of an input reference clock signal, wherein the circuit evaluates the output signals of the PLL Phase Frequency Detector (PFD) to establish how well the PLL is locked on to the Input Reference Clock.

In some embodiments, the circuit compares the duration of the PFD up-plus down-pulses with the duration of the not-up-plus not-down-pulses. In some embodiments, the circuit is operable to establish when the PFD up-plus down-pulses are smaller than a certain fraction of the not-up-plus not-down-pulses. In some embodiments, the fraction size is established through the sizes of the transistors used in the circuit. In some embodiments, the fraction size is established through digital inputs; in particular by programming. In some embodiments, the circuit has a speed of response controlled by a current input which generates a bias voltage, and a set of CMOS transistors configured as capacitors. In some embodiments, the circuit is operable to be used with any CMOS technology, independent of feature size. In some embodiments, the circuit is operable to be used with any PLL architecture that uses a Phase Frequency Detector to generate speed-up and slow-down pulses. In some embodiments, the circuit is operable to facilitate a reduction of the startup time of a system chip which uses a PLL. In some embodiments, the circuit is operable to detect that a PLL has lost lock-on, thereby improving system security.

A phase-locked loop circuit, in accordance with embodiments includes first phase detection circuitry having a first up and down outputs; second phase detection circuitry having second up and down outputs; and a lock on circuit configured to receive the first up and down outputs and the second up and down outputs and determine from the first up and down outputs and the second up and down outputs how well the phase-locked loop is locked on to a reference clock.

In some embodiments, the first up and down outputs are up and down pulses and the second up and down pulses are not up and not down pulses. In some embodiments, the lock on circuit is configured to compare the duration of up plus down pulses with the duration of the not up plus not down pulses. In some embodiments, the lock on circuit determines that a lock has occurred when the duration is smaller than a predetermined fraction of the reference clock. In some embodiments, the value of the fraction is determined according to: (Tvub+Tvdb)×(1+1×A0b+2×A1b+4×A2b)/8=(Tvuu+Tvdn)×8. In some embodiments, the phase-locked loop includes an input clock cycle counter configured to block lock-on from being indicated for a first duration when an accuracy setting is high and a second, longer duration, when the accuracy setting is low.

A lock-on detection circuit for a phase-locked loop in accordance with embodiments includes circuitry configured to receive first up and down outputs and second up and down outputs from one or more phase detectors and to determine from the first up and down outputs and the second up and down outputs how well the phase-locked loop is locked on to a reference clock. In some embodiments, the first up and down outputs are up and down pulses and the second up and down pulses are not up and not down pulses. In some embodiments, the circuitry is configured to compare the duration of up plus down pulses with the duration of the not up plus not down pulses. In some embodiments, the circuitry determines that a lock has occurred when the duration is smaller than a predetermined fraction of the reference clock. In some embodiments, the value of the fraction is determined according to: $(Tvub+Tvdb) \times (1+1 \times A0b+2 \times A1b+4 \times A2b)/8=(Tvuu+Tvdn) \times 8$. In some embodiments, an input clock cycle counter is provided and configured to block lock-on from being indicated for a first duration when an accuracy setting is high and a second, longer duration, when the accuracy setting is low.

A method for determining that a lock-on has occurred in a phase-locked loop circuit, in accordance with embodiments includes comparing the duration of up plus down pulses with the duration of not up plus not down pulses; and determining that a lock has occurred when the duration is smaller than a predetermined fraction of a reference clock. In some embodiments, the value of the fraction is determined according to: $(Tvub+Tvdb) \times (1+1 \times A0b+2 \times A1b+4 \times A2b)/8=(Tvuu+Tvdn) \times 8$. In some embodiments, the method includes blocking lock-on from being indicated for a first duration when an accuracy setting is high and a second, longer duration, when the accuracy setting is low.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

The disclosure and various features and advantageous details thereof are explained more fully with reference to the exemplary, and therefore non-limiting, embodiments illustrated in the accompanying drawings and detailed in the following description. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

According to various embodiments, an output signal is provided in a PLL circuit to indicate the output clock arrival and stability at the destination frequency. Thus, according to various embodiments, a circuit can be provided to detect and indicate when a phase-locked loop has reached the target frequency. This eliminates the need for the system to employ a counter which must be set to a longer duration than the actual PLL stable time and clocked by another oscillator. This effectively minimizes the time the system requires to reach high performance operations and provides for an improvement over conventional devices.

According to various embodiments, it is determined when a clock generated using a phase-locked-loop (PLL) is "good" enough; i.e., when the generated clock is stable enough, and close enough to the target multiple of the input clock. The stability and tolerance criterion depends on how the clock is to be used.

Figure 2:
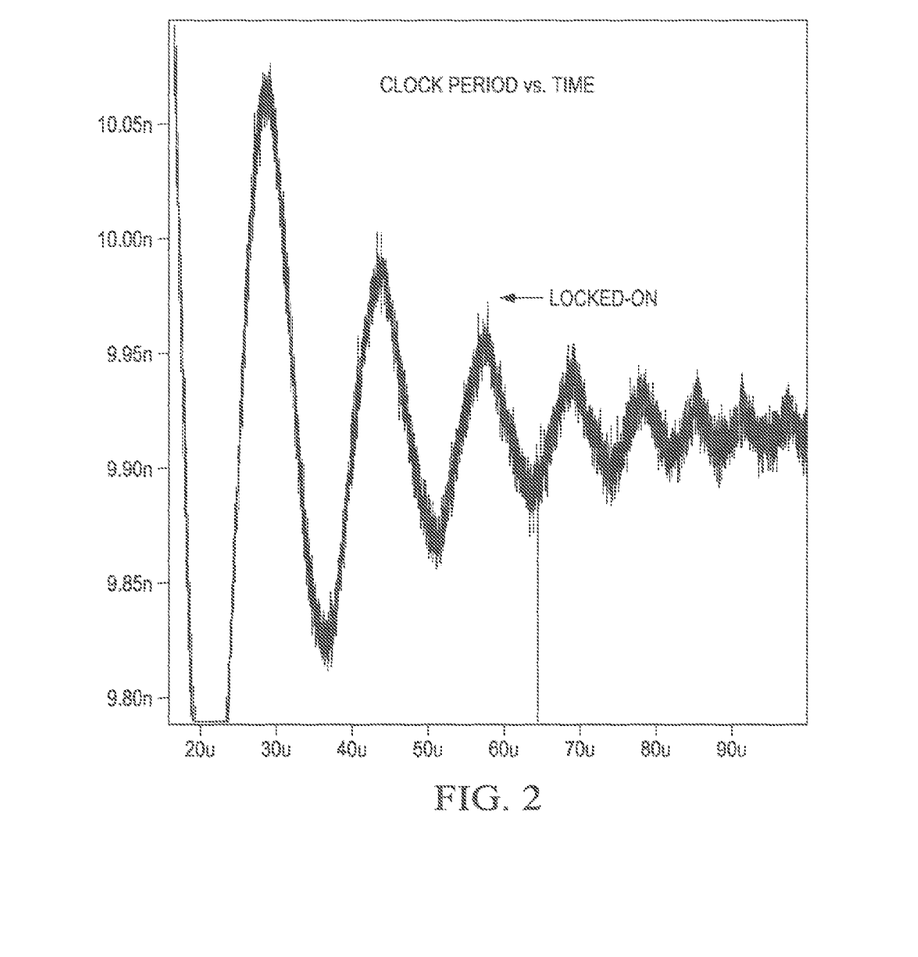
FIG. 2 illustrates example clock accuracy criterion.

Example clock accuracy criteria are shown with reference to FIG. 2. In particular, shown in FIG. 2 is a plot of clock period versus time. At the time the variance of the clock period reaches a certain threshold above the final variance, the circuit is deemed locked on.

According to various embodiments, a circuit can be provided that evaluates how well the output frequency of a phase-locked Loop (PLL) circuit matches the target output frequency. This can be done by evaluating the output signals of the phase frequency detector (PFD) module of the PLL, such that the size of the (speed) up- and (slow) down-signals is compared to the opposite PFD signals (don't speed up and don't slow down), and then evaluate when the ratio is small enough. This approach is a way of assessing when the clock jitter and noise is small enough.

Figure 3:
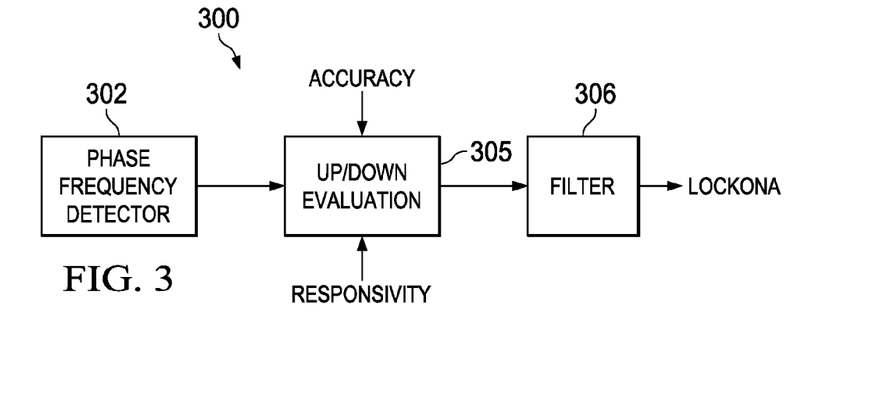
FIG. 3 is a block diagram of an example PLL circuit including up/down evaluation in accordance with embodiments.

FIG. 3 is a simplified diagram schematically illustrating a PLL circuit with a lock detection system in accordance with embodiments. In particular, the system 300 includes a PLL 302, lock on circuit 305 for up/down evaluation (as will be explained in greater detail below), and filter 306. As will be explained in greater detail below, lock on circuit 305 receives accuracy and responsivity control inputs and up and down signals from the PFD 302.

Figure 4:
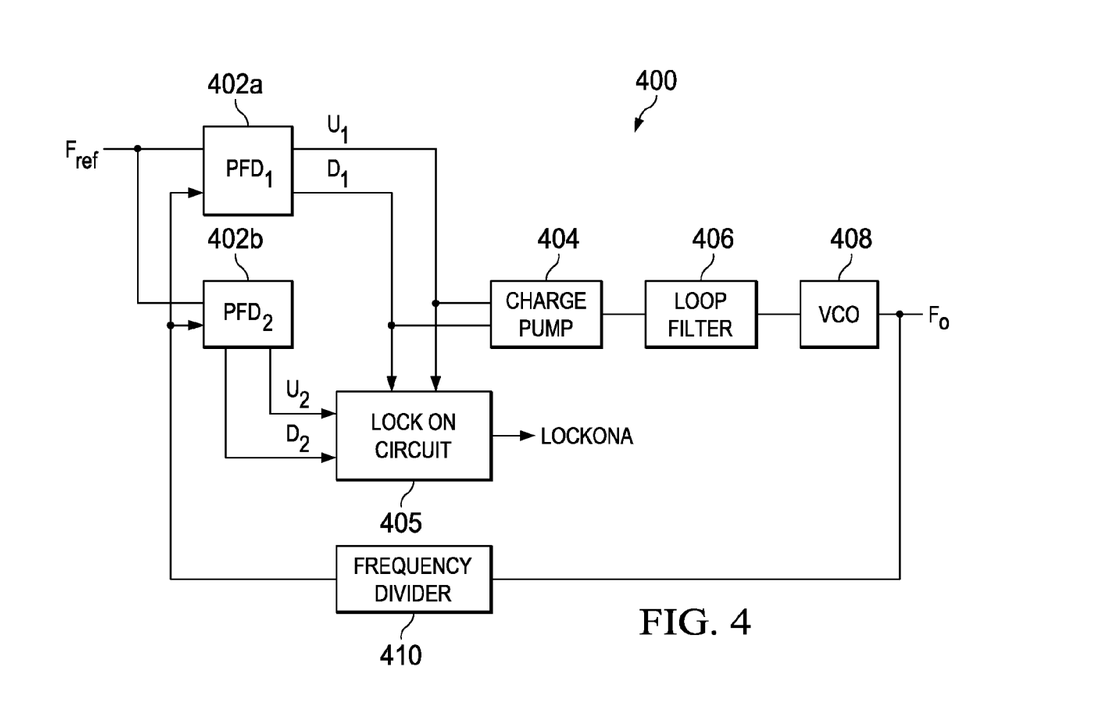
FIG. 4 is a block diagram of an exemplary PLL circuit in accordance with embodiments.

FIG. 4 is a diagram illustrating an exemplary PLL circuit 400 including lock detection in greater detail. The circuit 400 may be an embodiment of the circuit 300 of FIG. 3. In particular, FIG. 4 illustrates a phase locked loop circuit 400 generally similar to that of FIG. 1, but including first and second PFD circuitry such as first and second PFD modules 402*a*, 402*b*, as well as a lock on circuit 405. Thus, in circuit 400, the outputs of PFD module 402a are provided to charge pump 404 and then to loop filter 405, whose output is provided to VCO 408. Again a frequency divider 410 may be provided in the feedback path. As will be explained in greater detail below, the up-down outputs U1, D1 of PFD module 402a are compared with the up-down outputs U2, D2 of PFD module 402b in the lock on circuit 405 to assess the lock.

Figure 5:
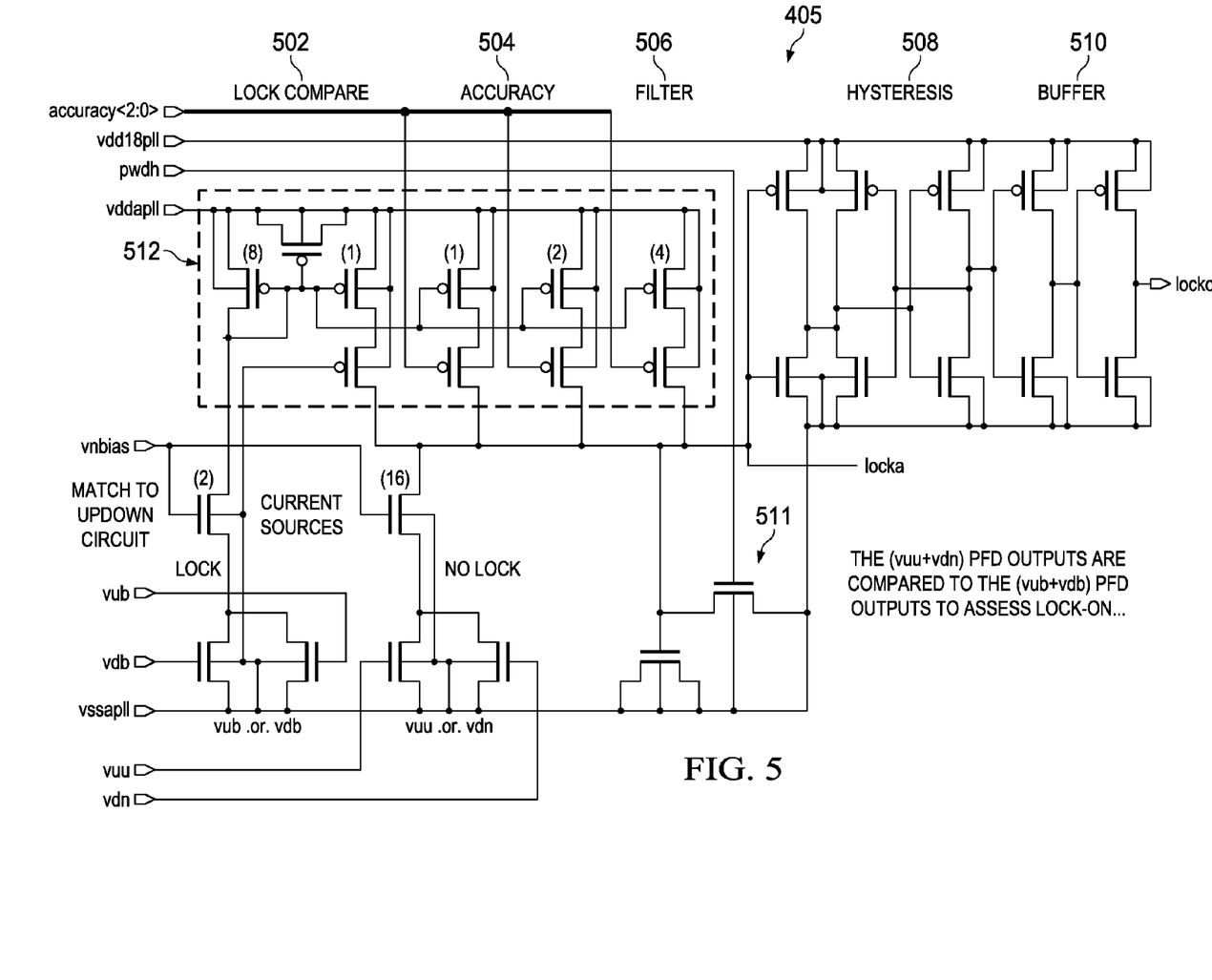
FIG. 5 is a diagram of an example lock-on circuit according to embodiments.

FIG. 5 illustrates an exemplary lock on circuit 405 in greater detail. The circuit 405 includes a lock compare module 502, an accuracy module 504, and may include filter 506, hysteresis module 508, and output buffer 510.

In general, the circuit allows for setting an accuracy value and receives as inputs the outputs of the PFD module 402a (vub, vdb) and PFD module 402b (vuu, vdn). These outputs are ORed and compared. That is, vuu+vdn is compared to vub+vdb to assess lock on.

Lock-on occurs when the duration T of the up/down pulses (vub, vdb) are less than a small fraction of the input clock period, which occurs when the vuu+vdn is less than a small fraction of vub+vdb.

The circuit has a speed of response controlled by the current input modules 502, 504, which generate controlled currents, and the CMOS transistors 511 configured as capacitors. This sets the bias voltage for the hysteresis comparator 508 which triggers the lock-on signal.

In some embodiments, this fraction is set using the accuracy<2:0> input.

For example, in some embodiments, this fraction is (8-Accuracy)/128. So if the accuracy is six, the fraction is 1/64; i.e., for a 4 MHz input the average duration of the up/down pulses can be 3.9 ns. As will be explained in greater detail below, the accuracy input is used to adjust the sensitivity of the lock-on detector.

The following equations apply:

$$(Tvub+Tvdb) \times (1+1 \times A0b+2 \times A1b+4 \times A2b)/8 = (Tvuu+Tvdn) \times 8 \quad (1)$$

$$(Tvub+Tvdb) \times (8-Accuracy)/8 = (Tvuu+Tvdn) \times 8 \quad (2)$$

$$(Tvub+Tvdb) \times (8-Accuracy)/64 = Tvuu+Tvdn \quad (3)$$

That is, the PLL is determined to be locked when the fractional durations match. In particular, Equation 1 is implemented with the transistors of the cascade current mirror (module 504) of FIG. 5. The currents are rationed 1:1, 1:2, 1:4, on the 8:1 in module 502. When the accuracy bits A0, A1, and A2 are (111) then the value on the left side is equal to Tvub+Tvdb)×(1+1+2+4)/8=Tvub+Tvdb. When the bits are turned off (000), the result is (Tvub+Tvdb)×⅛. One eighth of the total current will flow into the filter capacitor taking longer to charge it.

As illustrated, the circuit 405 receives vub, vdb inputs (i.e., the U1, D1 inputs) from PFD module 402a (FIG. 4)) and the vuu and vdn inputs (i.e., the U2, D2 inputs from PFD2 module 402b (FIG. 4)). The outputs vub+vdb and vuu+vdn are compared using circuit 502 to implement equation 3 as set by the accuracy circuit 504.

The multiplicand (1+1×A0b+2×A1b+4×A2b)/8 of Equation (1) is implemented using circuit 512. Additional filtering 506, hysteresis 508 and buffering 510 may be provided. In the embodiment illustrated, the lock on output takes on values indicating a lock.

The output of the filter (module 506) is an analog signal. After applying this signal to the hysteresis comparator 508, the digital lock-on signal lockon indicating the state of the PLL circuit is obtained. In some embodiments, the hysteresis comparator 508 has a trigger level set just above 1 V (e.g., about 1.5 times the threshold voltage of the transistors).

In a voltage-noisy system, the PLL will try to correct for the consequent period-noise, and this may cause the lock-on circuit to indicate loss of lock if the accuracy is set too high. In other words, since the lock-on detector is a circuit to evaluate that the PLL jitter plus frequency noise is low enough, voltage noise getting into the VCO can cause frequency variations sufficient to have the lock-on detector deem the PLL out of lock. To be flexible in this area, the accuracy input can be provided to allow making the lock-on detector less sensitive.

In particular, when the accuracy setting (i.e., the multiplication factor A) is low, some false indications of lock-on can be obtained when the PLL slips to achieve lock-on. However, when the multiplication factor is high, and feedback to the PFD is slow, the internal analog lock-on signal may be "wavery," i.e., moving up and down while transitioning, resulting in inappropriate indications of lock-on.

More specifically, as discussed above, for the lock-on detection to occur, the pulse width of the phase detector outputs are compared and when this value is smaller than a certain fraction of the PLL input clock (Fref) the circuit is "locked". The equation that determines the value of the fraction is:

$$(Tvub+Tvdb) \times (1+1 \times A0b+2 \times A1b+4 \times A2b)/8 = (Tvuu+Tvdn) \times 8$$

A0, A1, and A2 are the accuracy setting bits. For an input clock of 4 MHz when all the bits are turned on (111) then the up and down pulses width should be smaller than 3.9 ns in order for the PLL lock-on to occur. Because of jitter and frequency noise a false PLL lock detection may occur if the accuracy is set too low (000).

According to various embodiments, to overcome this, an input clock cycle counter may be provided that blocks lock-on from being indicated for a first duration when the accuracy setting is high and a second, longer duration, when the accuracy setting is low. In some embodiments, the lock-on is blocked for 64 clock cycles when the accuracy setting is high and 128 clock cycles when the accuracy setting is low.

Figure 6:
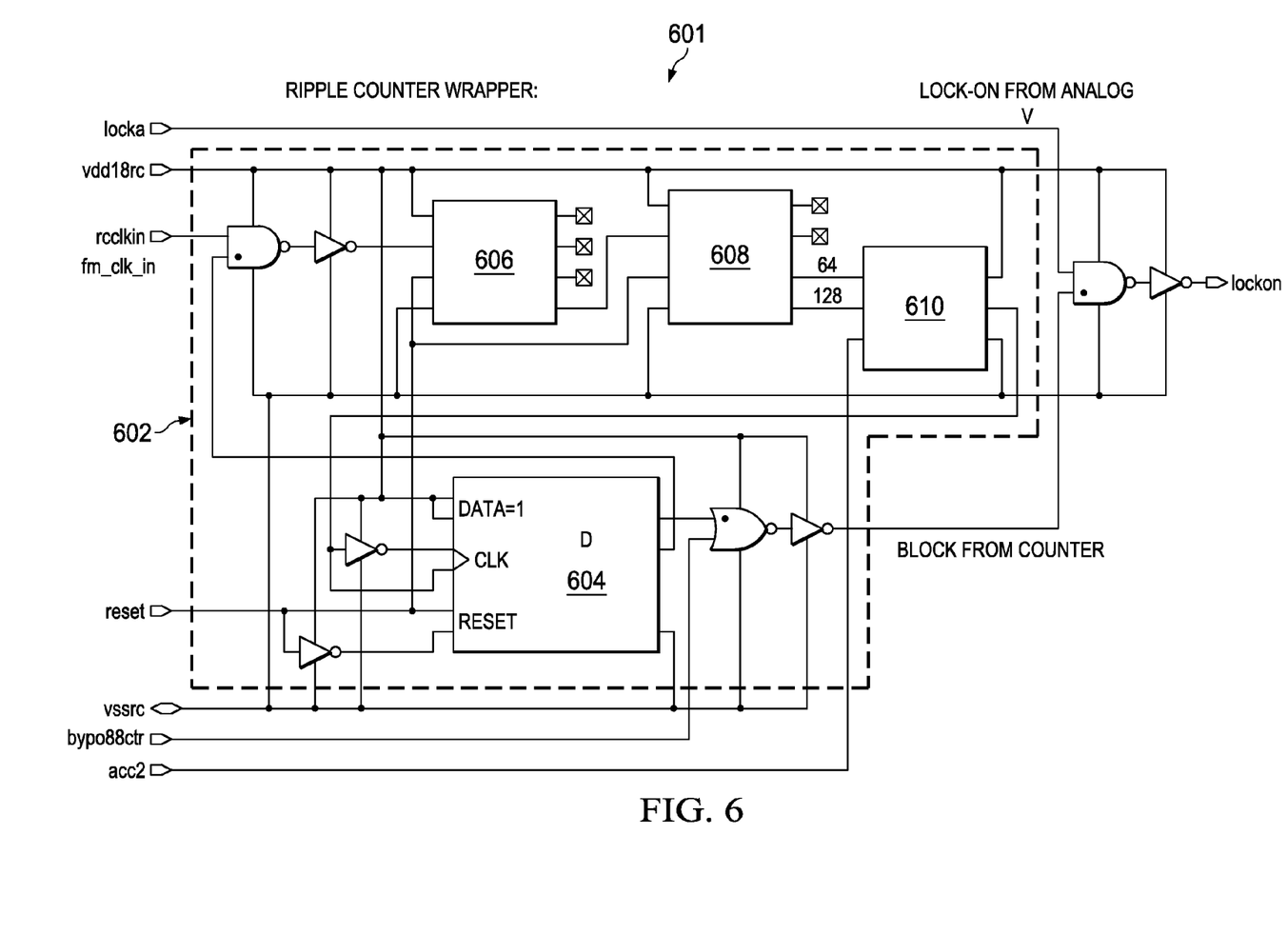
FIG. 6 is an example of a counter and lock-on block circuit according to embodiments.

The counter may be implemented as a four bit ripple counter 602, as shown in FIG. 6. In particular, ripple counter 602 includes stages 604, 606, 608, 610 and receives as inputs rccklin, and reset and vdd16rc and vssrc. The circuit further receives as inputs the acc2 accuracy signal and the locka signal. The D flip flop 604 (in reset/clock mode with data=1) is used to provide a block signal. The most significant bit (MSB) of the accuracy signal acc2 (A) is used to select which count is used to block the lock-on signal.

The circuit 601 in FIG. 6 compares the two lock-on signals at the input, the analog locka generated by the circuit in FIG. 5 and the output signal of the built-in ripple counter 602. In the embodiment illustrated, the ripple counter 602 will generate a digital lock signal based on the MSB (Most Significant Bit) bit A2 of the accuracy setting. In some embodiments, if this bit is set to "1" the signal will be generated after the input clock Fref is divided by 128 and if it is set to "0" after the clock is divided by 256. Additionally the signal bypassctr (bypo88ctr) allows the user to decide if he want to use the build in counter or not, in which case only the analog signal locka will determine the lock-on state of the PLL.

Figure 7:
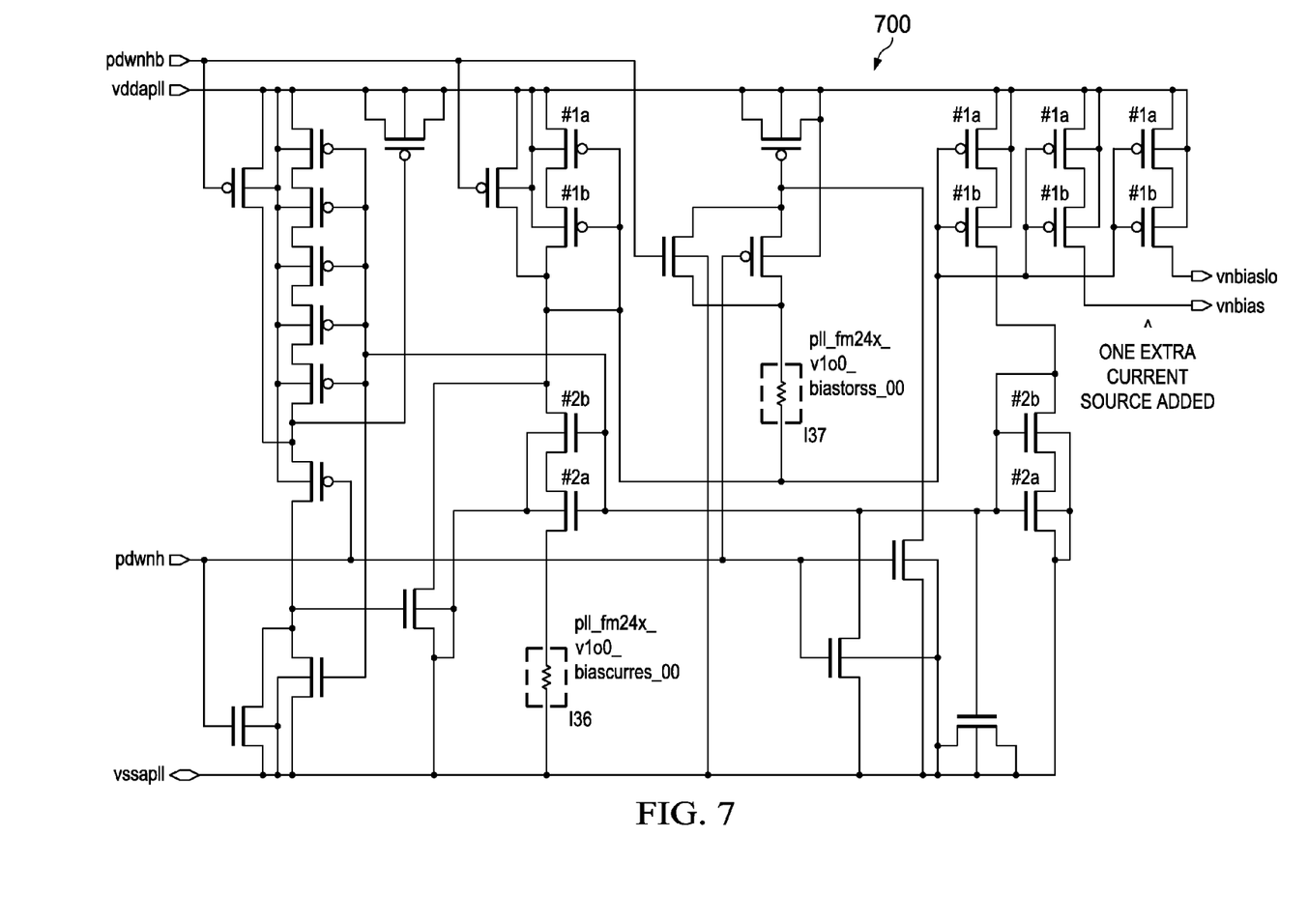
FIG. 7 is an example of a bias generator circuit according to embodiments.

Turning now to FIG. 7, some embodiments may provide a bias generator 700 for providing the currents for the internal PLL sub-modules charge pump 404 and lock-on detection 405. In the embodiment illustrated, the bias generator includes a start-up circuit on the left side, an NMOS cascode self-bias generator using the 136 resistor and the #2a, #2b transistors and PMOS cascode current mirror #1a, #1b on the right to generate the output currents vnbias and vnbiasio. These output currents have the same transistor ratio therefore the same value. The self-biased current generator is bi-stable and therefore requires a start-up circuit to guarantee the operation in the desired mode. The resistor 137 provides the bias voltage required by the output PMOS cascode mirror. Additionally, in the embodiment illustrated, the circuit has two complementary power-down signals pdwnhb and pdwnh to allow the complete turn-off of this module when the PLL is not used in order to minimize the stand-by current consumption of the chip.

Figure 8:
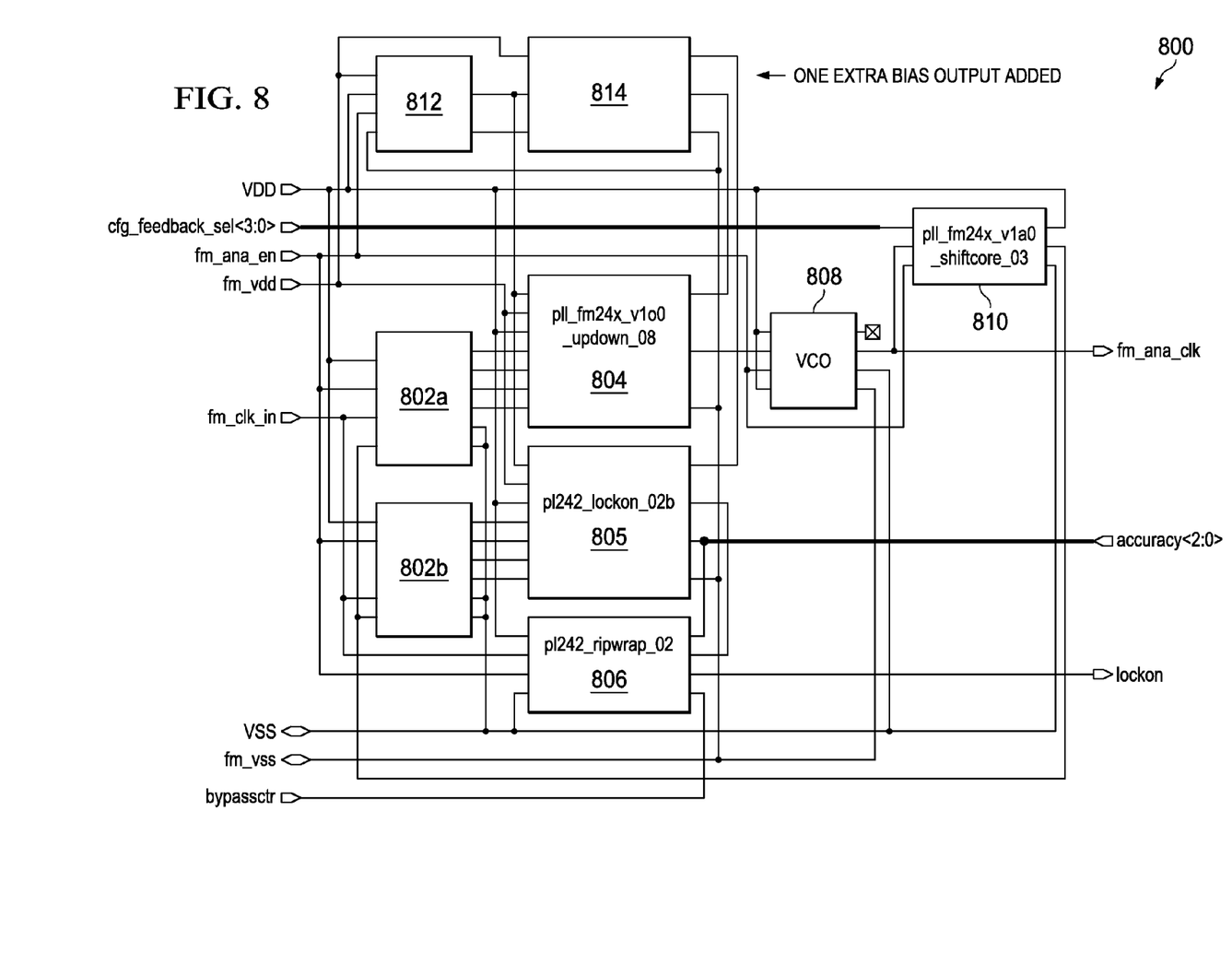
FIG. 8 is an example block diagram of a lock-on circuit according to embodiments.

FIG. 8 illustrates a phase-locked loop according to embodiments in greater detail. As shown, the phase locked loop 800 includes PFD1 802*a*, PFD2 802*b*, lock on circuit 805, ripple counter 806, charge pump and filter 804, VCO 808, frequency divider 810, as well as bias generator 814 and additional circuitry 812, which may be used to bypass or turn off the bias generator 814.

Figure 9:
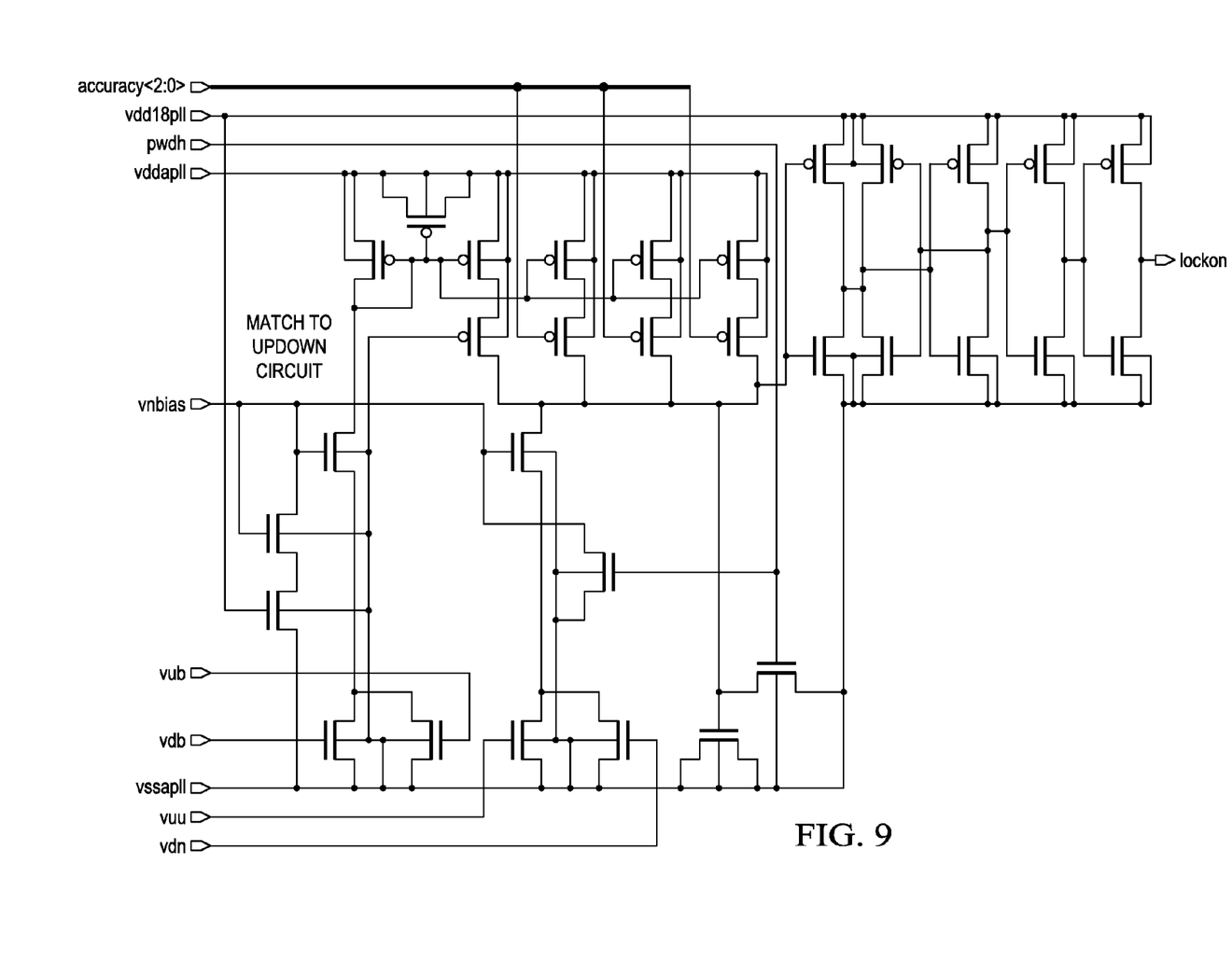
FIG. 9 is an example lock on circuit with bias generator according to embodiments.

Finally, FIG. 9 illustrates another implementation of the lock on circuit showing an additional current source configuration for the bias generator.

Although the invention has been described with respect to specific embodiments thereof, these embodiments are merely illustrative, and not restrictive of the invention. The description herein of illustrated embodiments of the invention, including the description in the Abstract and Summary, is not intended to be exhaustive or to limit the invention to the precise forms disclosed herein (and in particular, the inclusion of any particular embodiment, feature or function within the Abstract or Summary is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function, including any such embodiment feature or function described in the Abstract or Summary.

While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the claims that follow, a term preceded by "a" or "an" (and "the" when antecedent basis is "a" or "an") includes both singular and plural of such term, unless clearly indicated within the claim otherwise (i.e., that the reference "a" or "an" clearly indicates only the singular or only the plural). Also, as used in the description herein and throughout the claims that follow, the meaning of "in" includes "in" and "on" unless the context clearly dictates otherwise.

It will be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/Figures should be considered only as exemplary, and not limiting, unless otherwise specifically noted.

What is claimed is:

1. A Circuit to indicate when a divided down version of an output signal of a Phase Locked Loop (PLL) has a frequency close enough to the frequency of an input reference clock signal, wherein the circuit evaluates the output signals of the PLL Phase Frequency Detector (PFD) to establish a lock-on signal of the PLL with respect to the input reference clock signal, wherein the PFD provides for an up pulse signal, a down pulse signal, a not-up pulse signal and a not-down pulse signal, wherein the not-up pulse signal and the not-down pulse signal are complementary to the up pulse signal and the down pulse signal, respectively, wherein the circuit comprises a first OR gate receiving the up pulse signal and the down pulse signal and generating ORed up- and down-pulse signals, and a second OR gate receiving the not-up pulse signal and the not-down pulse signal and generating ORed not-up- and not-down- pulse signals, wherein the circuit is further configured to compare the duration of the ORed up- and down-pulse signals with the duration of the ORed not-up- and not-down- pulse signals, and wherein the circuit generates the lock-on signal when the duration of the ORed up- and down- pulse signals are smaller than a certain fraction of the duration of the ORed not-up- and not-down- pulse signals.

2. The circuit according to claim 1, wherein a size of the fraction is established through the sizes of a plurality of transistors used in the circuit.

3. The circuit according to claim 2, wherein the transistors are controlled through digital inputs by programming.

4. The circuit according to claim 1, wherein the circuit has a speed of response controlled by a chosen output current of said controllable current source.

5. The circuit according to claim 1, wherein the circuit is operable to be used with any CMOS technology, independent of feature size.

6. The circuit according to claim 1, wherein the circuit is operable to be used with any PLL architecture that uses a Phase Frequency Detector to generate speed-up and slow-down pulse signals.

7. The circuit according to claim 1, wherein the circuit is operable to facilitate a reduction of the startup time of a system chip which use a PLL.

8. The circuit according to claim 1, wherein the circuit is operable to detect that a PLL has lost lock-on, thereby improving system security.

9. The circuit of claim 1, further comprising:
first phase detection circuitry generating the up and down pulse signals;
second phase detection circuitry generating the not-up and not-down pulse signals.

10. The phase-locked loop circuit according to claim 9, wherein the fraction size is established through the sizes of a plurality of transistors used in the circuit.

11. The phase-locked loop circuit according to claim 10, wherein the transistors are controlled through digital inputs by programming.

12. The phase-locked loop circuit according to claim 9, wherein the circuit has a speed of response controlled by a chosen output current of said controllable current source.

13. The phase-locked loop circuit according to claim 9, wherein the value of the fraction is determined according to:

$$(TvubORTvdb) \times (8\text{-accuracy})/8 = (TvuuORTvdn) \times 8,$$

wherein Tvub, Tvdb, Tvuu and Tvdn represent the duration of the pulse signals, and accuracy is a digital value representing a chosen accuracy.

14. The phase-locked loop circuit according to claim 9, further including an input clock cycle counter configured to block the lock-on signal from being indicated for a first duration when an accuracy setting is high and a second, longer duration, when the accuracy setting is low.

15. The circuit according to claim 9, wherein the circuit is operable to be used with any CMOS technology, independent of feature size.

16. The circuit according to claim 9, wherein the circuit is operable to facilitate a reduction of the startup time of a system chip which use a PLL.

17. The circuit according to claim 9, wherein the circuit is operable to detect that a PLL has lost lock-on, thereby improving system security.

18. The circuit according to claim 1, wherein the up and down pulse signals and the not-up and not-down pulse signals each control a controllable current source charging a capacitor.

19. The circuit according to claim 18, wherein the capacitor is formed by a set of CMOS Transistors.

20. The circuit according to claim 18, wherein the controllable current source comprises a current mirror.

21. The circuit according to claim 18, further comprising a hysteresis comparator coupled with said capacitor.

22. A method for determining that a lock-on has occurred in a phase-locked loop circuit, comprising:
performing an OR function on up and down pulses provided by a PLL Phase Frequency Detector (PFD) unit to generate ORed up and down pulses;
performing an OR function on not-up and not-down pulses provided by the PLL Phase Frequency Detector (PFD) unit to generate ORed not-up and not-down pulses;
wherein the not-up and not-down pulses are complimentary to the up and down pulses, respectively;
comparing the duration of the ORed up and down pulses with the duration of the ORed not-up and not-down pulses; and
determining that a lock has occurred when the duration of the ORed up and down pulses is smaller than a predetermined fraction of the duration of the ORed not-up and not-down pulses.

23. The method of claim 22, wherein the value of the predetermined fraction is determined according to:

$$(TvubORTvdb) \times (8\text{-accuracy})/8 = (TvuuORTvdn) \times 8,$$

wherein Tvub, Tvdb, Tvuu and Tvdn represent the duration of the pulses, and accuracy is a digital value representing a chosen accuracy.

24. The method of claim 22, wherein a size of the fraction is established through the sizes of a plurality of transistors used in the circuit.

25. The method of claim 22, wherein the PLL Phase Frequency Detector (PFD) unit comprises a first PFD generating the up and down pulses and a second PFD generating the not-up and not-down pulses.

* * * * *